(12) United States Patent
Scharnagl et al.

(10) Patent No.: US 8,129,248 B2
(45) Date of Patent: Mar. 6, 2012

(54) METHOD OF PRODUCING BIPOLAR TRANSISTOR STRUCTURES IN A SEMICONDUCTOR PROCESS

(75) Inventors: Thomas Scharnagl, Tiefenbach (DE); Berthold Staufer, Moosburg (DE)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 12/833,573

(22) Filed: Jul. 9, 2010

(65) Prior Publication Data

US 2011/0165760 A1  Jul. 7, 2011

(30) Foreign Application Priority Data

Jul. 13, 2009  (DE) .................. 10 2009 032 854

(51) Int. Cl.
*H01L 29/70*  (2006.01)
*H01L 21/328*  (2006.01)

(52) U.S. Cl. . 438/309; 438/700; 438/701; 257/E29.171; 257/E21.09; 257/E21.372

(58) Field of Classification Search .................. 438/309, 438/700, 701, 704; 257/565, E21.171, E21.09, 257/E21.35, E21.372
See application file for complete search history.

(56) References Cited

U.S. PATENT DOCUMENTS

| | | | | | |
|---|---|---|---|---|---|
| 4,698,128 | A | * | 10/1987 | Berglund et al. | 438/701 |
| 4,764,245 | A | * | 8/1988 | Grewal | 438/700 |
| 4,902,377 | A | * | 2/1990 | Berglund et al. | 438/640 |
| 4,999,318 | A | * | 3/1991 | Takahumi et al. | 438/309 |
| 5,317,193 | A | * | 5/1994 | Watanabe | 257/774 |
| 5,366,848 | A | * | 11/1994 | Thane et al. | 430/313 |
| 5,663,091 | A | * | 9/1997 | Yen et al. | 438/600 |
| 6,040,247 | A | * | 3/2000 | Chung | 438/713 |
| 6,137,135 | A | * | 10/2000 | Kubo et al. | 257/328 |
| 6,313,019 | B1 | * | 11/2001 | Subramanian et al. | 438/585 |
| 6,495,294 | B1 | * | 12/2002 | Yamauchi et al. | 438/597 |
| 2003/0052088 | A1 | * | 3/2003 | Khan et al. | 216/67 |
| 2004/0178171 | A1 | * | 9/2004 | Nagarajan | 216/13 |
| 2004/0212045 | A1 | * | 10/2004 | Tilke et al. | 257/586 |
| 2006/0189124 | A1 | * | 8/2006 | Beer et al. | 438/622 |
| 2006/0281246 | A1 | * | 12/2006 | Tegen | 438/232 |
| 2008/0014725 | A1 | * | 1/2008 | Todd | 438/482 |
| 2008/0054304 | A1 | * | 3/2008 | Sadaka et al. | 257/194 |
| 2009/0224363 | A1 | * | 9/2009 | Yoshida | 257/532 |
| 2009/0301549 | A1 | * | 12/2009 | Moslehi | 136/251 |
| 2010/0171223 | A1 | * | 7/2010 | Kuo et al. | 257/773 |

FOREIGN PATENT DOCUMENTS

DE   10 2009 032 854.8   7/2009
* cited by examiner

*Primary Examiner* — Hsien Ming Lee
*Assistant Examiner* — Michele Fan
(74) *Attorney, Agent, or Firm* — Jacqueline J. Garner; Wade J. Brady, III; Frederick J. Telecky, Jr.

(57) ABSTRACT

In the method of producing bipolar transistor structures in a semiconductor process, an advanced epitaxial trisilane process can be used without the risk of poly stringers being formed. A base window is structured in a polycrystalline silicon layer covered with an oxide layer, and a further step is epitaxial growing of a silicon layer in the base window from trisilane. The window structuring is performed in a sequence of anisotropic etch and isotropic ash steps, thereby creating stepped and inwardly sloping window edges. Due to the inwardly sloping side walls of the window, the epitaxially grown silicon layer is formed without inwardly overhanging structures, and the cause of poly stringers forming is thus eliminated.

1 Claim, 2 Drawing Sheets

METHOD OF PRODUCING BIPOLAR TRANSISTOR STRUCTURES IN A SEMICONDUCTOR PROCESS

FIELD OF THE INVENTION

The invention relates to a method of producing bipolar transistor structures in a semiconductor process, in particular transistor structures in BICOM (bipolar complementary) technology.

BACKGROUND

In a typical sequence of a BICOM fabricating process the window for a transistor base is usually structured by means of an anisotropic plasma etching step. The window defined by a patterned resist layer is thus structured with straight side walls that extend through a polycrystalline silicon layer (hereinafter "poly") covered with an oxide layer. For epitaxial ("EPI") growing of a silicon layer in the base window an advanced trisilane ($Si_3H_8$) epitaxial process is a preferred option due to the low cost and high yield of that process. With shrinking component dimensions and increasing thickness of the polycrystalline silicon layer, however, the trisilane epitaxial process is not applicable due to the forming of residual poly stringers after structuring that epitaxial layer by etching, as will be explained in more detail with reference to the appending drawings. These stringers affect operation of the resulting circuit component.

SUMMARY

In one aspect of the invention a method of producing bipolar transistor structures in a semiconductor process is provided, wherein an advanced epitaxial trisilane process can be used without the risk of poly stringers being formed. In accordance with the invention, the method of producing bipolar transistor structures in a semiconductor process comprises the step of structuring, by plasma etching, a base window in a polycrystalline silicon layer covered with an oxide layer, and the further step of epitaxial growing a silicon layer in the base window from trisilane. The plasma etching is performed in a sequence of anisotropic etch and isotropic ash steps, thereby creating stepped and inwardly sloping window edges. Due to the inwardly sloping side walls of the window, the epitaxially grown silicon layer is formed without inwardly overhanging structures, and the cause of poly stringers forming is thus eliminated.

DETAILED DESCRIPTION OF AN EXAMPLE EMBODIMENT

Figure 1A:
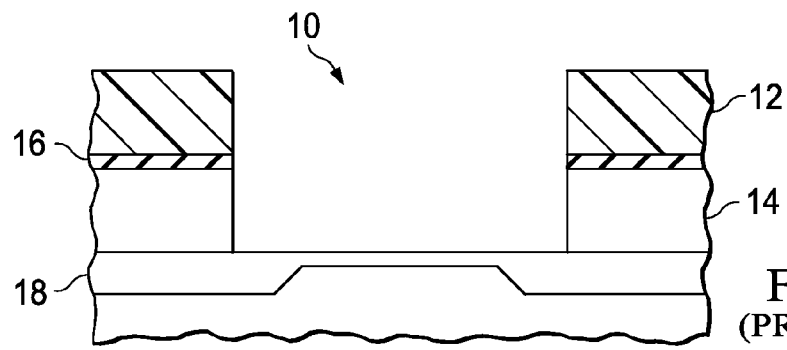
FIG. 1a to 1e are schematic sectional views illustrating successive semiconductor process steps in the formation of a bipolar transistor base window that would result in the occurrence of poly stringers.

In FIG. 1a, a bipolar base window 10 is shown as defined by a patterned resist 12 and extending through a polycrystalline silicon layer 14 covered by an oxide layer 16. The window is structured using an anisotropic plasma etching step. As a result the window has straight side walls that extend all the way through the oxide layer 16 and the poly layer 14 down to an underlying oxide layer 18.

Figure 1B:
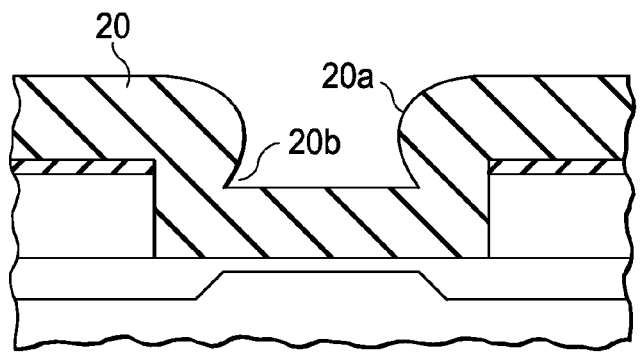

If, as illustrated in FIG. 1b, an EPI layer 20 is subsequently grown in the exposed window and over the adjacent oxide layer 16 using an advanced trisilane epitaxial process, the EPI layer 20 is formed with inwardly bulged overhanging beads 20a. Underneath the beads 20a, outwardly directed recesses 20b are formed.

Figure 1C:
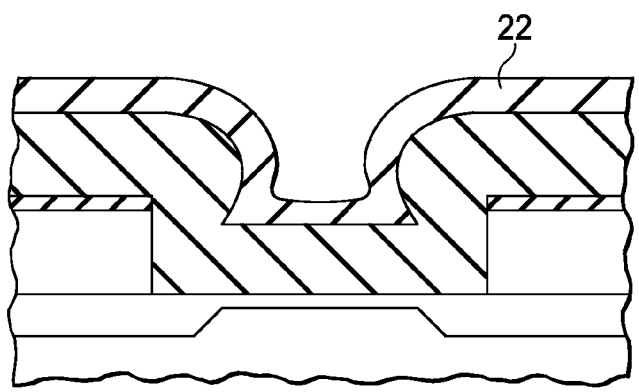

In a subsequent process step, as illustrated in FIG. 1c, dielectric layers 22 (oxide, nitride, etc.) are deposited over the EPI layer 20. The dielectric layers 22 completely fill the recesses 20b left by the EPI layer 20.

Figure 1D:
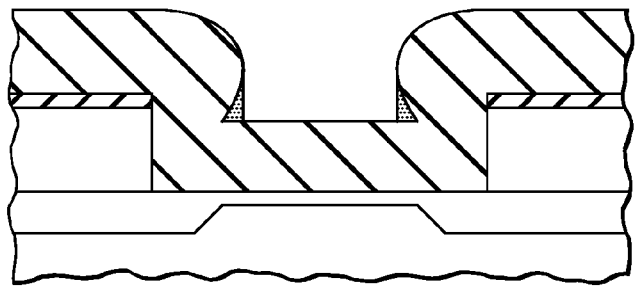

In a further subsequent process step, as illustrated in FIG. 1d, anisotropic plasma etching cannot remove the dielectric material from the recesses 20b. An alternative wet etching step is not possible for reasons of process technology.

Figure 1E:
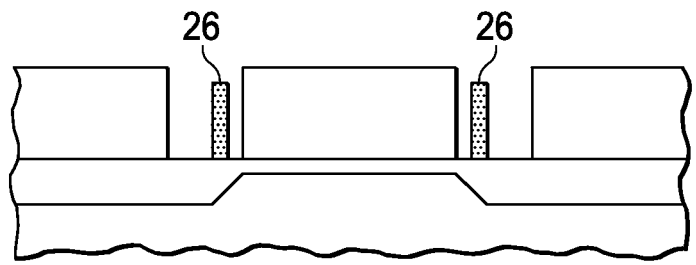

When the EPI layer 20 is then structured, as illustrated in FIG. 1e, the residual dielectric material from the recesses 20b acts like a screen to the anisotropic etching, and any material from the EPI layer that is located immediately underneath will not be removed, thereby leaving "poly stringers" 26 next to the structured part of the EPI layer. These poly stringers can make the semiconductor component inoperative.

Figure 2A:
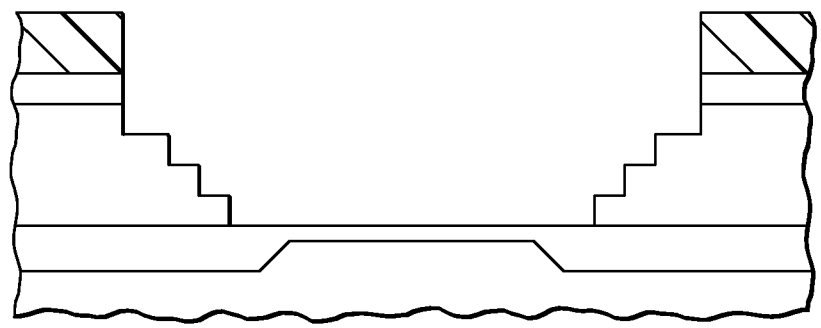
FIGS. 2a and 2b are schematic sectional views illustrating alternative semiconductor process steps in the formation of a bipolar transistor base window that avoid the occurrence of poly stringers.

Turning now to FIG. 2a, the inventive method involves shaping of the base window with side walls that are stepped and slope inwardly of the window, as shown. This is achieved with a plasma etch process that consists of sequential anisotropic etch and isotropic ash steps. The sequential anisotropic etch and isotropic ash steps must be adjusted so as to achieve the desired shape of the window side walls.

Figure 2B:
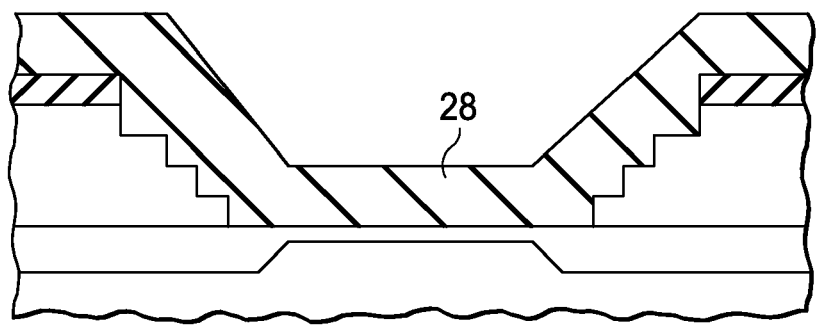

When the EPI layer is then grown over the base window using a trisilane epitaxial process, as shown in FIG. 2b, an EPI layer 28 is obtained free from overhanging beads, and the EPI layer can be structured without any risk of forming poly stringers.

Although the invention has been described hereinabove with reference to a specific embodiment, it is not limited to this embodiment and no doubt further alternatives will occur to the skilled person that lie within the scope of the invention as claimed.

The invention claimed is:

1. A method of producing bipolar transistor structures in a semiconductor process, comprising the steps of:
    structuring, by plasma etching, a base window in a polycrystalline silicon layer covered with an oxide layer;
    epitaxial growing a silicon layer in the base window from trisilane;
wherein said plasma etching is performed in a sequence of anisotropic etch and isotropic ash steps, thereby creating stepped and inwardly sloping window edges.

* * * * *